(12) United States Patent
Wu et al.

(10) Patent No.: US 11,623,873 B2
(45) Date of Patent: Apr. 11, 2023

(54) SUBSTRATE-FREE CRYSTALLINE 2D BISMUTHENE

(71) Applicant: Purdue Research Foundation, West Lafayette, IN (US)

(72) Inventors: Wenzhuo Wu, West Lafayette, IN (US); Yixiu Wang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 442 days.

(21) Appl. No.: 16/685,114

(22) Filed: Nov. 15, 2019

(65) Prior Publication Data

US 2020/0180974 A1    Jun. 11, 2020

Related U.S. Application Data

(60) Provisional application No. 62/776,046, filed on Dec. 6, 2018.

(51) Int. Cl.
| | |
|---|---|
| *C01G 29/00* | (2006.01) |
| *C30B 7/14* | (2006.01) |
| *C30B 29/10* | (2006.01) |
| *C30B 29/60* | (2006.01) |

(52) U.S. Cl.
CPC ............... *C01G 29/00* (2013.01); *C30B 7/14* (2013.01); *C30B 29/10* (2013.01); *C30B 29/60* (2013.01); *C01P 2002/20* (2013.01); *C01P 2002/74* (2013.01); *C01P 2004/20* (2013.01); *Y10T 428/2982* (2015.01)

(58) Field of Classification Search
CPC ...................................................... C01G 29/00
See application file for complete search history.

(56) References Cited

PUBLICATIONS

Guo et al. Sub-200 fs solitone mode-locked fiber laser based on bismuthene saturable absorber, Optics Express, vol. 26, No. 18, Sep. 3, 2018 (Year: 2018).*

Reis, F., Bismuthene on a SiC substrate: A candidate for a high-temperature quantum spin Hall material. Science 357, 287-290 (2017).

Wang, W. Z. et al., Shape Control of Single Crystalline Bismuth Nanostructures, J. Phys. Chem. B, 110, No. 51, pp. 25702-25706, 2006.

Yang, Q. et al., 2D bismuthene fabricated via acid-intercalated exfoliation showing strong nonlinear near-infrared responses for mode-locking lasers, Nanoscale, 10, pp. 21106-21115, 2018.

* cited by examiner

*Primary Examiner* — Alexandre F Ferre
(74) *Attorney, Agent, or Firm* — Purdue Research Foundation

(57) ABSTRACT

The present disclosure generally relates to compositions comprising substrate-free crystalline 2D bismuthene, and the method of making and using the substrate-free crystalline 2D bismuthene.

8 Claims, 4 Drawing Sheets

SUBSTRATE-FREE CRYSTALLINE 2D BISMUTHENE

CROSS-REFERENCE TO RELATED APPLICATION

This application claims the benefits of U.S. Provisional Application Ser. No. 62/776,046, filed Dec. 6, 2018, the contents of which are incorporated herein entirely.

TECHNICAL FIELD

The present disclosure generally relates to compositions comprising substrate-free crystalline 2D bismuthene, and the method of making and using the substrate-free crystalline 2D bismuthene.

BACKGROUND

This section introduces aspects that may help facilitate a better understanding of the disclosure. Accordingly, these statements are to be read in this light and are not to be understood as admissions about what is or is not prior art.

Research in 2D materials, as inspired by the development of graphene, has experienced an explosive increase in recent years, due to their unique and exceptional properties with promising applications in electronic, photonic, energy and environmental devices. The 2D group-IV materials including silicene, germanene and stanene have been realized experimentally after graphene. For group-V elements, few-layer black phosphorus, named phosphorene, has also been successfully fabricated by exfoliation, which exhibits prominent properties such as high carrier mobility and high on/off ratio.

Although 2D bismuthene and its potentially important features and applications important have been reported, the reported 2D bismuthene has to be supported on a substrate. See Reis, F., et al., Bismuthene on a SiC Substrate: A Candidate for a New High-Temperature Quantum Spin Hall Paradigm, Science 357, 287-290 (2017). Thus, the applications of 2D bismuthene materials are greatly hindered.

Therefore, there remains a need to develop a method to make substrate-free 2D bismuthene due to its potential applications in electronics, optoelectronics, energy conversion and energy storage.

SUMMARY

The present disclosure provides compositions comprising substrate-free crystalline 2D bismuthene, and the method of making and using the substrate-free crystalline 2D bismuthene.

In one embodiment, the present disclosure provides substrate-free crystalline 2D bismuthene.

In one embodiment, the present disclosure provides a method of preparing substrate-free crystalline 2D bismuthene, wherein the method comprises reductive reaction of $NaBiO_3$ with a capping polymer and a polyol.

BRIEF DESCRIPTION OF THE DRAWINGS

FIG. 7 3D illustration of the structure of the 2D bismuthene.

DETAILED DESCRIPTION

Figure 1:
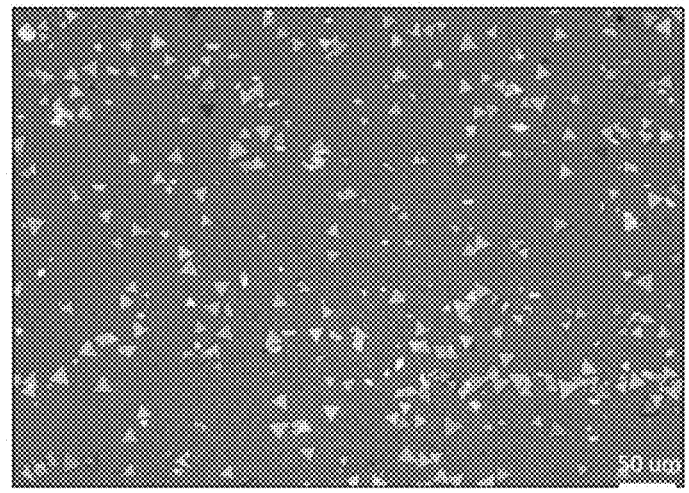
FIG. 1 shows optical image of the as-prepared 2D bismuthene.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 10%, within 5%, or within 1% of a stated value or of a stated limit of a range.

In the present disclosure the term "substantially" can allow for a degree of variability in a value or range, for example, within 90%, within 95%, or within 99% of a stated value or of a stated limit of a range.

In the present disclosure, the term "2D bismuthene" refers to an allotrope of bismuth element. The term "2D bismuthene" refers the allotrope in the form of two-dimensional, atomic scale, and hexagonal lattice. One well-known 2D material is graphene, which is an allotrope of carbon.

In the present disclosure, the term "substrate-free 2D bismuthene" refers to 2D bismuthene crystals that are prepared through a solution condition instead of being deposited on a substrate as disclosed by Reis, F., et al. regarding 2D bismuthene on SiC substrate. The disadvantage of 2D bismuthene on substrate is that such material cannot be easily used and is not available as standalone 2D bismuthene crystal. Therefore, the substrate-free 2D bismuthene disclosed in the present disclosure provides a standalone, stable and convenient source of pure 2D bismuthene. A skilled artisan will appreciate that "substrate-free 2D bismuthene" refers to "substrate-free 2D bismuthene" as made. The later prepared composition by any other physical and/or chemical mixing or combining the as made "substrate-free 2D bismuthene" with another material, even could be named as "substrate", should still be within the definition of "substrate-free 2D bismuthene" as defined here.

In one embodiment, the present disclosure provides substrate-free crystalline 2D bismuthene.

In one embodiment, the present disclosure provides substrate-free crystalline 2D bismuthene nanoparticles.

In one embodiment, the present disclosure provides substrate-free crystalline 2D bismuthene nanoflakes.

In one embodiment, the present disclosure provides substrate-free crystalline 2D bismuthene having single crystalline nature.

In one embodiment, the present disclosure provides substrate-free crystalline 2D bismuthene nanoflakes having substantially equilateral triangle shape. In one aspect, the length of each side of the substantially equilateral triangle shape is 0.1-100 µm, 0.1-80 µm, 0.1-60 µm, 0.1-40 µm, 1-100 μm, 1-80 μm, 1-60 μm, 1-40 μm, 10-100 μm, 10-80 μm, 10-60 μm, 10-40 μm, or any combination thereof.

In one embodiment, the present disclosure provides substrate-free crystalline 2D bismuthene nanoflakes having single or multilayer structure with a thickness of 0.1-30 nm, 0.1-20 nm, 0.1-10 nm, 0.1-5 nm, 0.1-3 nm, 1-30 nm, 1-20 nm, 1-10 nm, 1-5 nm, 1-3 nm, or any combination thereof.

In one embodiment, the present disclosure provides substrate-free crystalline 2D bismuthene nanoflakes that are characterized by an X-ray diffraction pattern (CuKα radiation, λ=1.54056 A) comprising a peak at 26.16 (2θ±0.10), and optionally one or more peaks selected from the group consisting of 36.99, 38.64, 47.67, and 55.14 (2θ±0.10).

In one embodiment, the present disclosure provides a method of preparing substrate-free crystalline 2D bismuthene nanoflakes, wherein the method comprises reductive reaction of NaBiO$_3$ with a capping polymer and a polyol. In one aspect, the polymer may be but is not limited to poly(vinylpyrrolidone) (PVP, MW1 300 000), the polyol may be but is not limited to ethylene glycol.

In one embodiment, the present disclosure provides a method of preparing substrate-free crystalline 2D bismuthene nanoflakes, wherein the method comprises:

dissolving the capping polymer in the polyol to form a mixture of the capping polymer and the polyol;

heating the mixture to an elevated temperature for a period of time and then cooling the mixture to ambient temperature;

adding NaBiO$_3$ to the mixture of the capping polymer and the polyol, and heating the newly formed mixture to an elevated temperature for a period of time; and cooling the reaction mixture to ambient temperature to provide the substrate-free crystalline 2D bismuthene nanoflakes.

Synthesis of Crystalline 2D Bismuthene Nanoflakes

The crystalline 2D bismuthene nanoflakes with substantially uniform shape were prepared by a polyol process. The primary reaction involved the reduction of NaBiO$_3$ (99.6%, Aldrich) with ethylene glycol (EG, 99.8%, Aldrich) in the presence of the capping polymer poly(vinylpyrrolidone) (PVP, MW1 300 000) (Aldrich). First, 0.1472 g PVP (MW 1300000) was dissolved into 40 mL EG with strong stirring with temperature raising up to 100° C. for 7 hours. After the whole solution cooling down to room temperature, 0.412 g NaBiO$_3$ were added into above solution with vigorous stirring for another 8 hours. We can see the solution become light yellow. Then, we can pour this light-yellow solution into a 50 mL Teflon-lined stainless-steel autoclave. Consequently, the autoclave was sealed and maintained at 180° C. for 20 hours. The autoclave was then cooled to room temperature naturally. The resulting yellow products were precipitated by centrifugation at 5,000 r.p.m. for 5 min and washed three times with distilled water (to remove any ions remaining in the final product).

XRD Patterns of the Crystals

The XRD patterns of the crystals are obtained on a D8 Advance X-ray powder diffractometer, equipped with a CuKa source (λ=1.54056 A) and a Vantec detector, operating at 40 kV and 40 mA. Each sample is scanned between 20° and 65° in 2θ, with a step size of 0.0057° in 2θ and a scan rate of 11.41 seconds/step, and with 2.1 mm divergence and receiving slits and a 0.1 mm detector slit. The crystalline 2D bismuthene nanoflakes are deposited on the Si wafer with smooth surface. The crystal form diffraction patterns are collected at ambient temperature and relative humidity. The background for the crystal is removed by Jade 6.5 prior to peak picking.

Conformation of a crystal form may be made based on any unique combination of distinguishing peaks (in units of ° 2 θ), typically the more prominent peaks. Thus, a prepared sample of crystalline 2D bismuthene nanoflakes is characterized by an XRD pattern using CuKa radiation as having diffraction peaks (2-theta values) as demonstrated in Table 1.

TABLE 1

| X-Ray Crystal Diffraction Peaks of crystalline 2D bismuthene | | |
|---|---|---|
| Angel °2 θ | Intensity Ratio (012) | Crystallographic plane |
| 26.16 | 1.00 | (012) |
| 36.99 | 0.39 | (104) |
| 38.64 | 0.39 | (110) |
| 47.67 | 0.24 | (202) |
| 55.14 | 0.19 | (024) |

Figure 2:
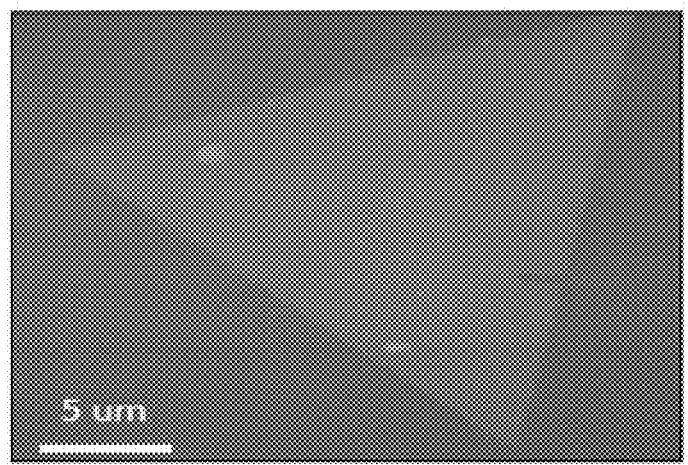
FIG. 2 shows atomic force microscopy (AFM) image of a single 2D bismuthene triangle nanoflake.
Figure 3:
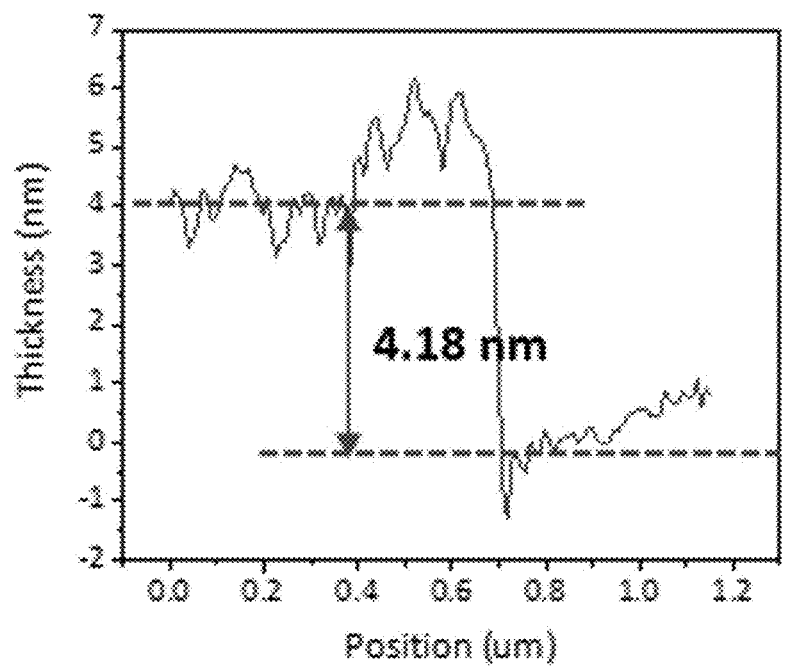
FIG. 3 shows an atomic-thin 2D bismuthene with 4.18 nm thickness.
Figure 4:
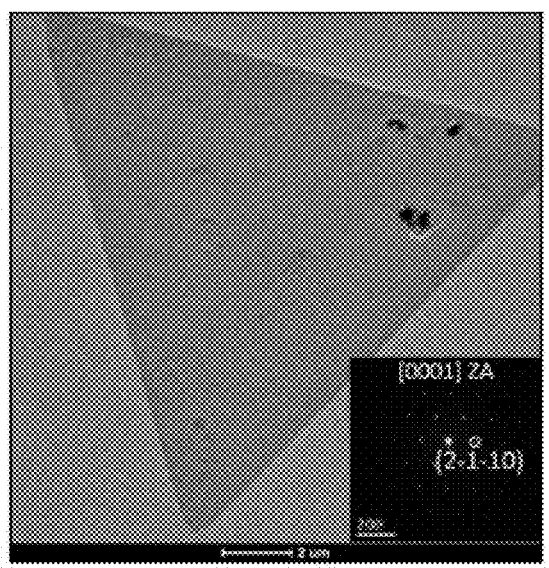
FIG. 4 shows Transmission Electron Microscopy (TEM) image of a single 2D bismuthene triangle nanoflake with the Selected Area Diffraction (SAED) as the inset obtained by aligning the electron beam perpendicular to the surface of the 2D bismuthene nanoflake.
Figure 5:
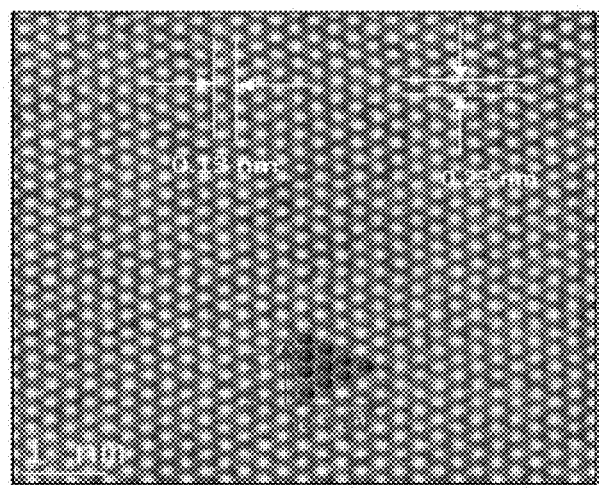
FIG. 5 shows High Resolution Transmission Electron Microscopy (HRTEM) image with clear lattice fringes that confirm the highly crystalline nature of the as prepared 2D bismuthene.
Figure 6:
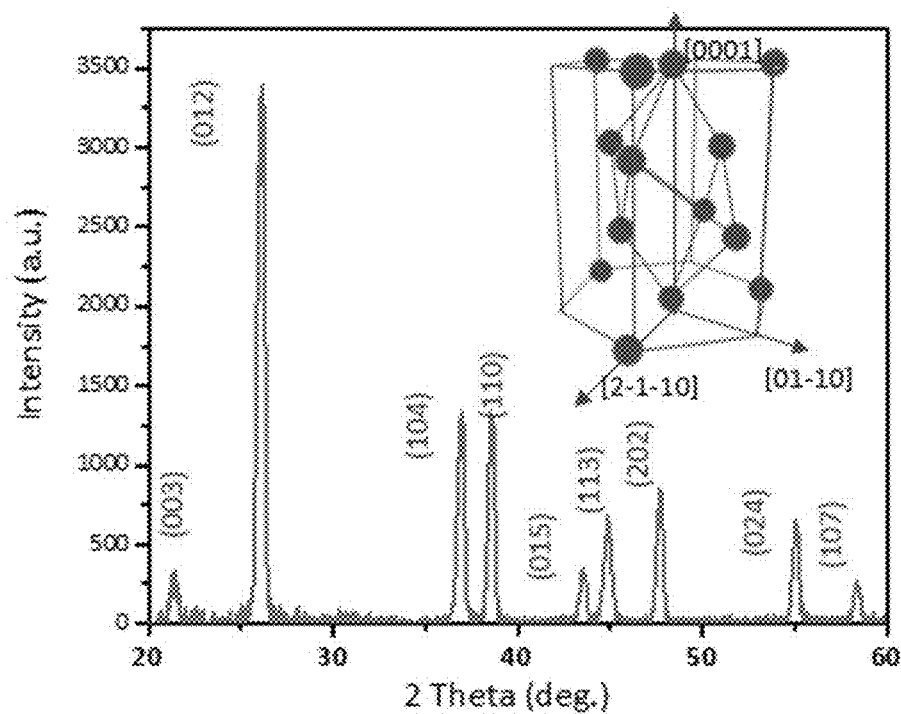
FIG. 6 shows the typical 2-theta XRD pattern of the as-prepared 2D bismuthene nanoflakes.
Figure 7:
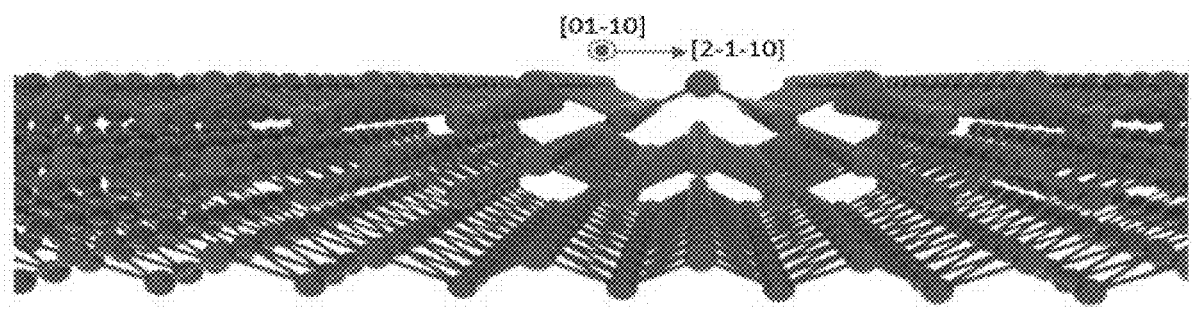

FIG. 1-7 provided optical images/data of the as prepared 2D bismuthene. The optical image FIG. 1 clearly indicated the morphology of the as-synthesized 2D bismuthene. Each 2D bismuthene nanoflake has an equilateral triangle shape with length of the 20-30 um side length. Atomic force microscopy (AFM) verified the nature smooth of 2D bismuthene surface. FIG. 2 and FIG. 3 showed an atomic-thin 2D bismuthene with about 4.18 nm thickness. FIG. 4 showed the TEM image of a single triangle nanoflake with the SAED as the inset obtained by aligning the electron beam perpendicular to the surface of the 2D bismuthene. The hexagonal symmetric diffraction pattern indicates the single crystalline nature of the nanoflake. FIG. 5 showed the HRTEM image with clear lattice fringes that confirm the highly crystalline nature. The spacing of 0.23 nm and 0.13 nm corresponds to the (2-1-10) and (01-10) panes of 2D bismuthene. FIG. 6 showed the typical 2-theta XRD pattern of the as-prepared 2D bismuthene nanoflakes. All diffraction peaks were indexed to the rhombohedral Bi structure (JCPDS No. 05-0519, R-3m). The inset is the schematic of the rhombohedral lattice structure of bismuth belonging to space group R-3m, together with the hexagonal unit cell. (thin lines) The 3D schematic image in FIG. 7 indicates that the sample grow laterally along the <01-10> and <2-1-10> directions, with vertical stacking along <0001> direction.

In summary, a simple, low-cost, solution-based chemical pathway to the scalable synthesis and assembly of substrate-free 2D bismuthene was developed. This approach has the potential to produce stable, high-quality, ultrathin semiconductors with a good control of composition, structure, and dimensions for applications in electronics, optoelectronics, energy conversion, energy storage, sensors, and quantum devices. The substrate-free 2D bismuthene therefore adds a new class of nanomaterials to the large family of 2D materials and enables possibilities for the further investigation of many exciting properties and intriguing applications.

2-D bismuthene is predicted to be 2D topological-insulator (quantum spin Hall) at high-temperatures (potentially even close to room temperature) that would facilitate the practical deployment of topological and hybrid electronic quantum materials. Due to the intrinsic spin-orbit coupling, bismuth is a promising candidate in spintronic devices with no demand for an external strong magnetic field. Bulk bismuth is a semi-metal, while 2-D bismuthene with the thickness thinner than the Fermi wavelength could see a transition from semimetal to semiconductor because of the quantum confinement effect.

2-D bismuthene could also be a good thermoelectric material, a photothermal material for potential photothermal treatment of cancer/tumor cells in vivo, exhibits diverse promising applications in electronics, optics, thermoelectricity, superconductivity, and as a candidate for a new high-temperature Quantum Spin Hall paradigm, etc. in quantum electronics.

Those skilled in the art will recognize that numerous modifications can be made to the specific implementations described above. The implementations should not be limited to the particular limitations described. Other implementations may be possible.

The invention claimed is:

1. A composition comprising substrate-free crystalline 2D bismuthene nanoflakes having a substantially equilateral triangle shape.

2. The composition of claim 1, wherein the crystalline 2D bismuthene nanoflakes have single crystalline nature.

3. The composition of claim 1, wherein the length of each side of the substantially equilateral triangle shape is 0.1-100 µm.

4. The composition of claim 1, wherein the crystalline 2D bismuthene nanoflakes have multilayer structure with a thickness of 0.1-30 nm.

5. The composition of claim 1, wherein the crystalline 2D bismuthene nanoflakes are characterized by an X-ray diffraction pattern (CuKα radiation, λ=1.54056 A) comprising a peak at 26.16 (2θ±0.1°), and optionally one or more peaks selected from the group consisting of 36.99, 38.64, 47.67, and 55.14 (2θ±0.1°).

6. A method of preparing the substrate-free crystalline 2D bismuthine nanoflakes according to claim 1, wherein the method comprises reductive reaction of $NaBiO_3$ with a capping polymer and a polyol.

7. The method of claim 6, wherein the method comprises steps:
dissolving the capping polymer in the polyol to form a mixture of the capping polymer and the polyol;
heating the mixture to an elevated temperature for a period of time and then cooling the mixture to ambient temperature;
adding $NaBiO_3$ to the mixture of the capping polymer and the polyol, and heating the newly formed mixture to an elevated temperature for a period of time; and
cooling the reaction mixture to ambient temperature to provide the substrate-free crystalline 2D bismuthene nanoflakes.

8. The method of claim 6, wherein the polyol is ethylene glycol, the capping polymer is polyvinylpyrrolidone (PVP).

* * * * *